(12) United States Patent
Hedler et al.

(10) Patent No.: US 6,727,576 B2
(45) Date of Patent: Apr. 27, 2004

(54) TRANSFER WAFER LEVEL PACKAGING

(75) Inventors: Harry Hedler, Germering (DE);
Thorsten Meyer, Erlangen (DE);
Barbara Vasquez, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/044,000

(22) Filed: Oct. 31, 2001

(65) Prior Publication Data
US 2003/0080399 A1 May 1, 2003

(51) Int. Cl.$^7$ ................................................ H11L 23/02
(52) U.S. Cl. ........................ 257/678; 257/675; 257/738; 257/778; 257/780; 438/106
(58) Field of Search ................................ 257/738, 780, 257/675, 778; 438/106

(56) References Cited

U.S. PATENT DOCUMENTS 6,537,848 B2 * 3/2003 Camenforte et al. ........ 438/106

* cited by examiner

*Primary Examiner*—David Nelms
*Assistant Examiner*—Mai-Huong Tran
(74) *Attorney, Agent, or Firm*—Fish & Richardson

(57) ABSTRACT

A semiconductor structure and a method for forming the semiconductor structure, including a semiconductor chip and a conductive layer disposed over a portion of the chip, the conductive layer having a portion that extends beyond an edge of the chip. The chip includes a device, which can be an integrated circuit or a micro-mechanical device. The structure can also include a front layer extending beyond the edge of the chip, the conductive layer being disposed on the front layer.

16 Claims, 20 Drawing Sheets

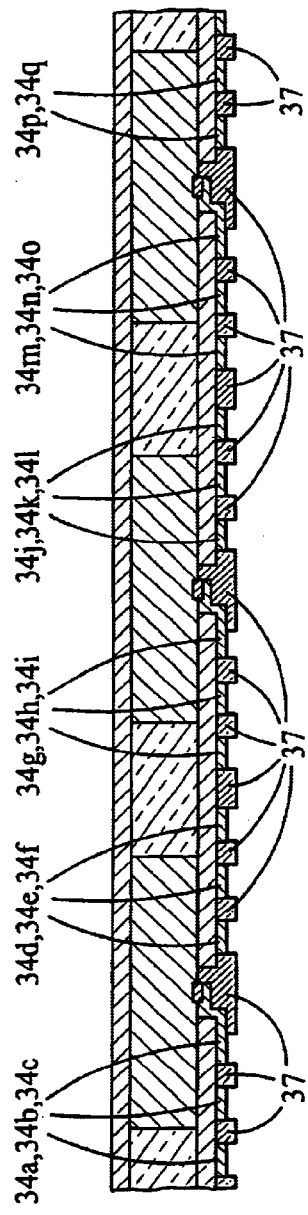
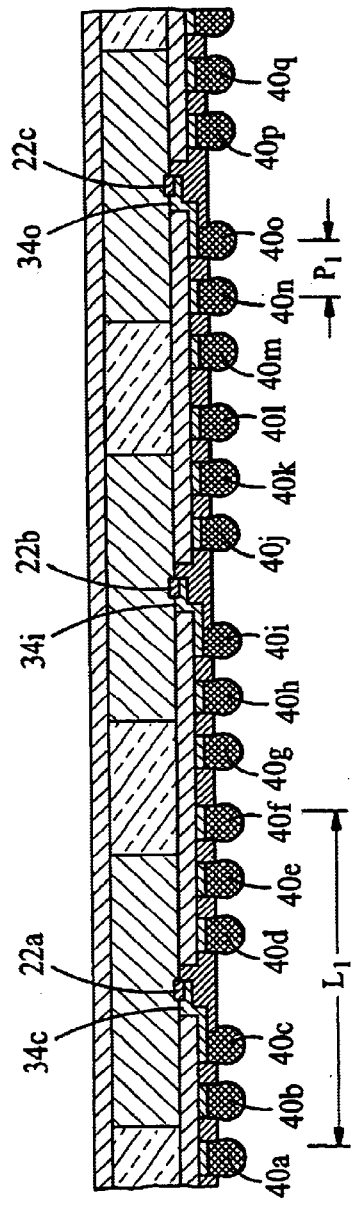
FIG. 5D
FIG. 6

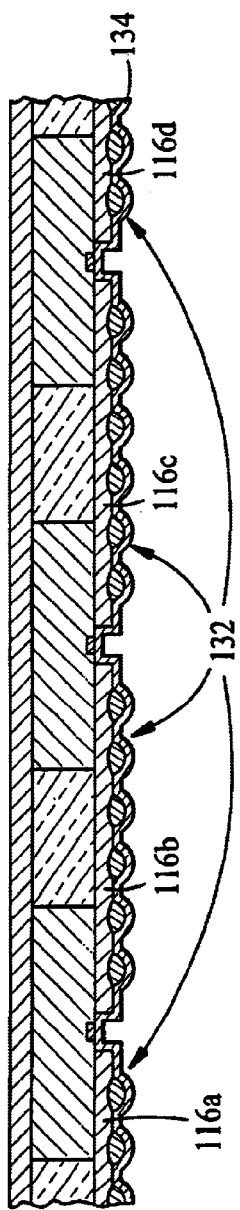
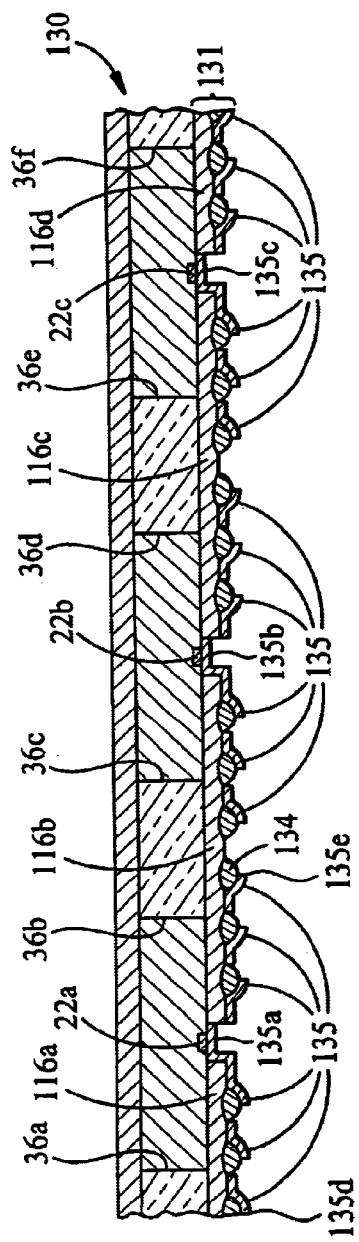
FIG. 14A
FIG. 14B

TRANSFER WAFER LEVEL PACKAGING

TECHNICAL FIELD

This invention relates to semiconductor wafer processing, and more particularly to semiconductor wafer level packaging.

BACKGROUND

In wafer level packaging processes, chips are packaged before singulation. These processes are presently limited to fan-in packaging, i.e. all packaging elements of a chip must fall within the shadow of the chip. Any elements formed outside the shadow of the chip are not supported and are destroyed upon singulation of the chip. The requirement that packaging elements fall within the chip's shadow presents a challenge as device geometries shrink.

The use of an interposer board between a chip and a printed circuit board enables one to fan out interconnections beyond a chip's edge. A chip is connected to the interposer board with connection in the chip's shadow, and the interposer board and out the connections to the desired pitch. The interposer board, however, adds a level of complexity, thereby reducing reliability and increasing costs. The interposer board also adds bulk to the placement of a chip on a printed circuit board.

Equipment for wafer-level burn-in of semiconductor devices, i.e. testing of devices under heat for extended periods of time, needs to be robust enough with sufficient protection to handle large deviations between functioning and non-functioning devices.

SUMMARY

In an aspect of the invention, a semiconductor structure comprises a semiconductor chip and a conductive layer disposed over a portion of the chip, the conductive layer having a portion that extends beyond an edge of the chip.

Embodiments can include the following. The conductive layer comprises a metal line. The chip comprises a device. The device comprises an integrated circuit. The device comprises a micro-electromechanical device. The semiconductor structure also includes a contact pad disposed on a surface of the device, and a portion of the conductive layer is in electrical communication with the contact pad. The structure has a front layer, with a first portion disposed on a first surface of the semiconductor chip, and a second portion extending beyond the edge of the chip, the conductive layer being disposed on the front layer. The front layer is a dielectric layer. The front layer is compliant. The front layer includes a bump.

In another aspect of the invention, a semiconductor structure includes a semiconductor chip and a front layer. The front layer has a first portion disposed on a first surface of the semiconductor chip, and a second portion extending beyond an edge of the chip.

In another aspect of the invention, a method for making a semiconductor structure includes providing a semiconductor chip having a device formed thereon and forming a layer over a portion of the device, such that a portion of the layer extends beyond an outer edge of the device.

Embodiments can include the following. The layer is a conductive layer. A line is defined in the conductive layer. A front layer is formed, having a first portion disposed on a first surface of the device, and a second portion extending beyond the edge of the device, with the conductive layer being disposed on the front layer. The device is formed proximate a first surface of the chip, and an encapsulating layer is formed proximate a second surface of the chip, so that the portion of the front layer extends beyond the outer edge of the device extends over the encapsulating layer.

Another aspect of the invention includes a method for making a semiconductor structure by providing a plurality of semiconductor chips and forming a first encapsulating layer between each of the semiconductor chips, such that the encapsulating layer bonds the chips together. In some embodiments, a second encapsulating layer is formed over the backside of the chips.

An advantage of an aspect of the inventive concept is that wafer level packaging steps are carried out on substrates larger than the size of a commercially available semiconductor wafer. Typically, wafer level packaging is done with, e.g., silicon wafers having maximum diameters of 300 mm. Printing technology, however, is readily available for processing substrates with dimensions of up to 600 mm. Printing technology is, therefore, a cost-effective method for processing multiple chips simultaneously.

Another advantage of an aspect of the inventive concept is the possibility to singulate dies by cutting through only soft encapsulating material instead of hard silicon. The former procedure is faster and therefore cheaper than the latter.

Another advantage of an aspect of the inventive concept is that burn-in of devices can be carried out on a reconstituted wafer having only known good die. Burn-in equipment can, therefore, be less complex.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1A–8 are cross-sectional and top views illustrating semiconductor chips at various stages during an execution of a method for packaging thereof;

Like reference symbols in the various drawings indicate like elements.

DETAILED DESCRIPTION

Figure 1A:
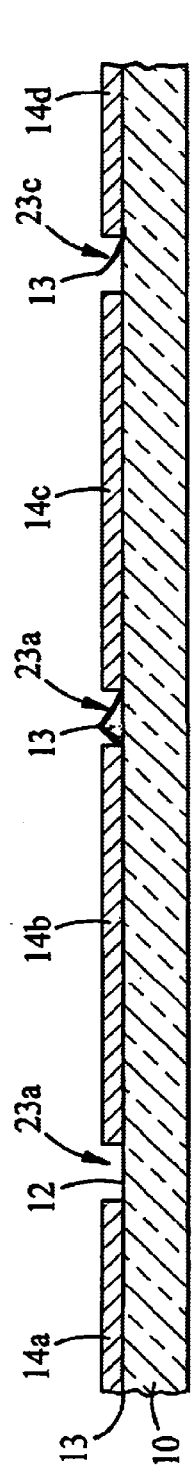
Figure 1B:
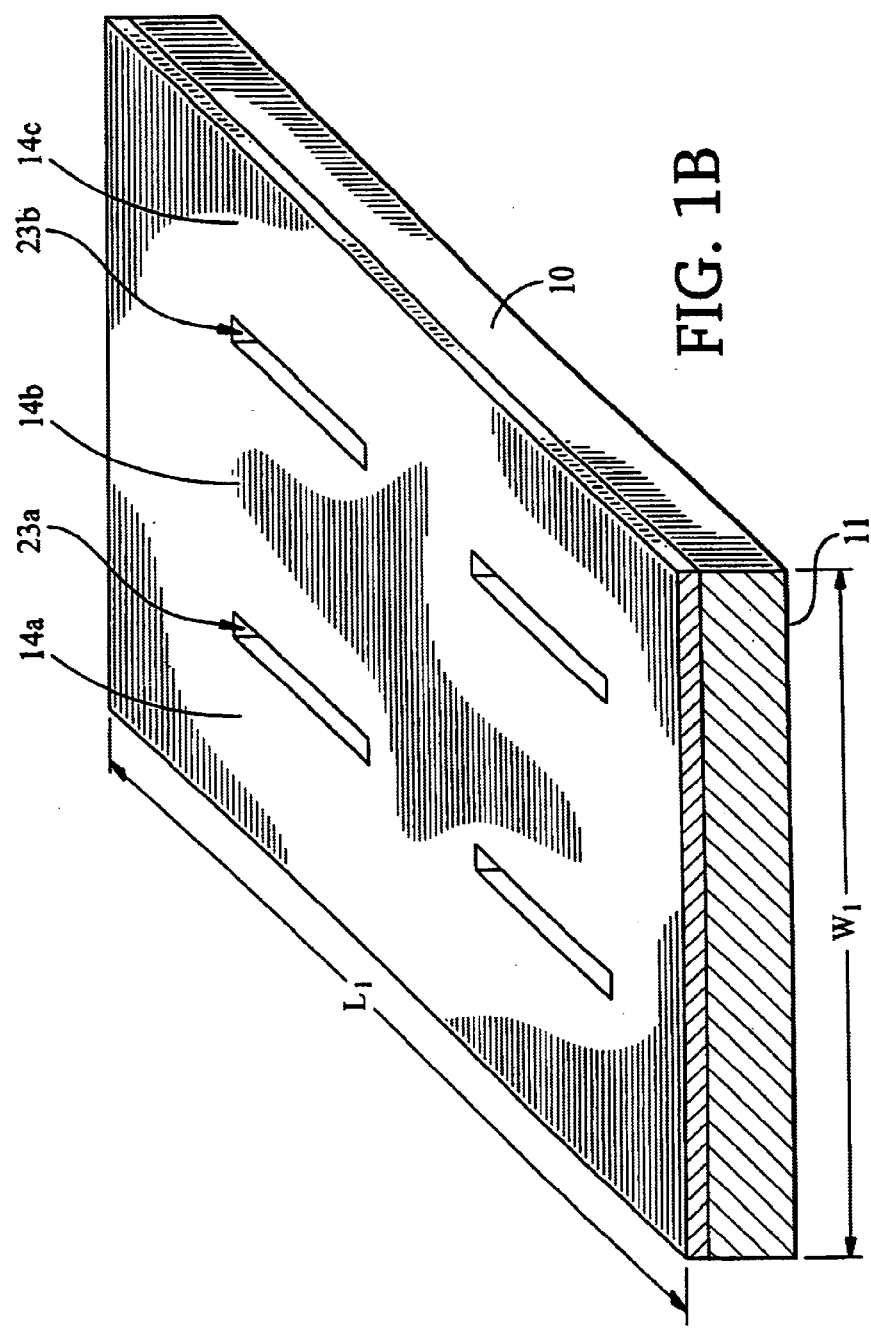

Referring to FIGS. 1A and 1B, in a first embodiment, a flat transfer substrate 10 is made of a rigid material, for example, glass. Substrate 10 has sides 11, 13 having, respectively, a width $W_1$ of, e.g., 300 mm and a length $L_1$ of e.g., 300 mm. A dielectric material, e.g., silicone, is deposited on a top surface 12 of glass transfer substrate 10 and patterned to form a plurality of dielectric regions 14a–14d. The dielectric material is deposited and patterned by thick film printing using, for example, a P5 system manufactured by EKRA, having a manufacturing center in Bönningheim, Germany. A monatomic layer 13 of polypropylene is deposited on top surface 12 prior to the deposition of the dielectric layer to reduce the adhesion of the dielectric layer to substrate 10. Dielectric regions 14a–14d define gaps 23a–23c.

Figure 2A:
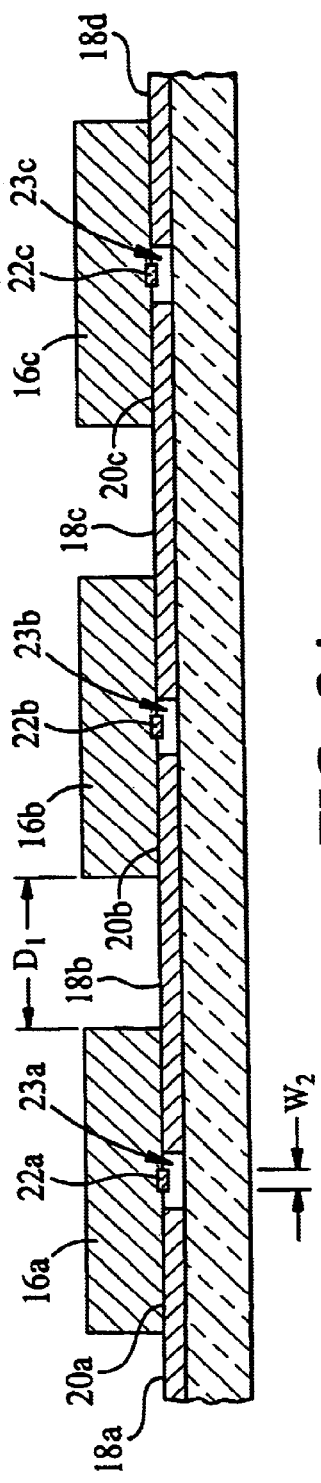
Figure 2B:
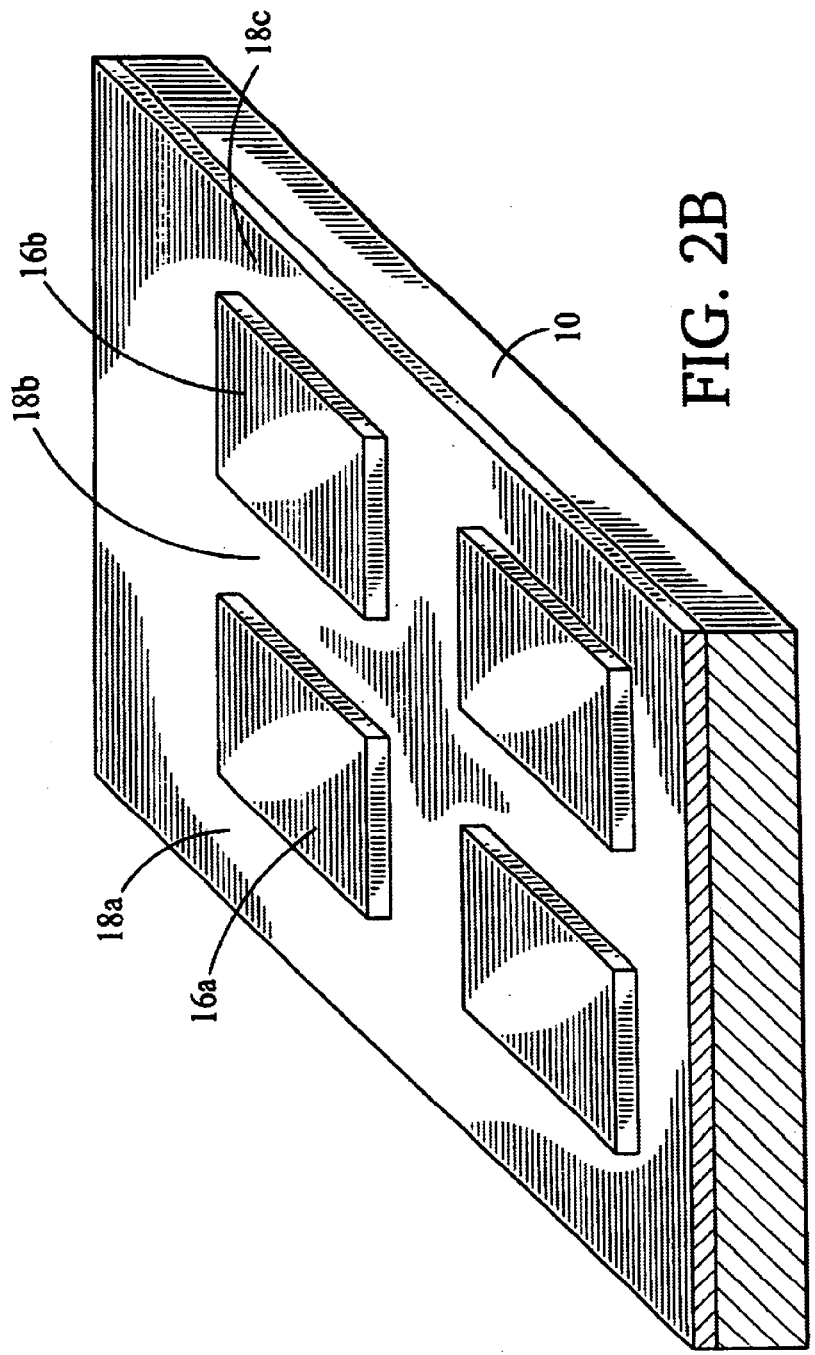

Referring to FIGS. 2A and 2B, first, second, and third singulated semiconductor chips 16a–16c, hereinafter referred to as "chips" or "semiconductor chips," are fabricated from a semiconducting material such as silicon. Chips 16a–16c include devices, such as integrated circuits. First, second, and third chips 16a–16c are all good chips that have already been tested and have been found to meet functionality requirements. First semiconductor chip 16a is flipped over and placed on top surfaces 18a–18b of dielectric regions 14a–14b, thereby bridging the dielectric regions 14a–b. Top surface 20a of chip 16a thereby contacts top surfaces 18a–18b. Second and third singulated chips 16b, 16c are similarly positioned on top surfaces 18b–18d of dielectric regions 14b–14d. Semiconductor chips 16a–16c are placed on the dielectric regions 14a–14d in a bonding machine, e.g., 2200 apm die bonder, manufactured by Datacon, based in Austria. Chips 16a–16c adhere to dielectric regions 14a–14d because they have not yet been cured and are therefore still sticky after deposition. Chip 16a has a first metal contact pad 22a with a width $W_2$ of, e.g., 50 μm. Second and third chips 16b, 16c also have second and third metal contact pads 22b, 22c, respectively. Metal contact pads 22a–22c are positioned proximate gaps 23a–23c separating dielectric regions 14b–14d. Metal contact pads 22a–22c thereby remain uncovered. In order to facilitate later photolithographic steps, chip 16a is placed on substrate 10 a distance $D_1$ from chip 16b, within an accuracy of 20 μm. $D_1$ is, for example, 50 μm to 200 μm. The desired accuracy is achievable with a bonding machine, e.g., the 2200 apm die bonder.

Subsequent to placing chips 16a–16c on transfer substrate 10, transfer substrate 10 is placed in an oven. Dielectric regions 14a–14d are then cured in the oven at the curing temperature for silicone of 150° C. for ~30 minutes.

Figure 3A:
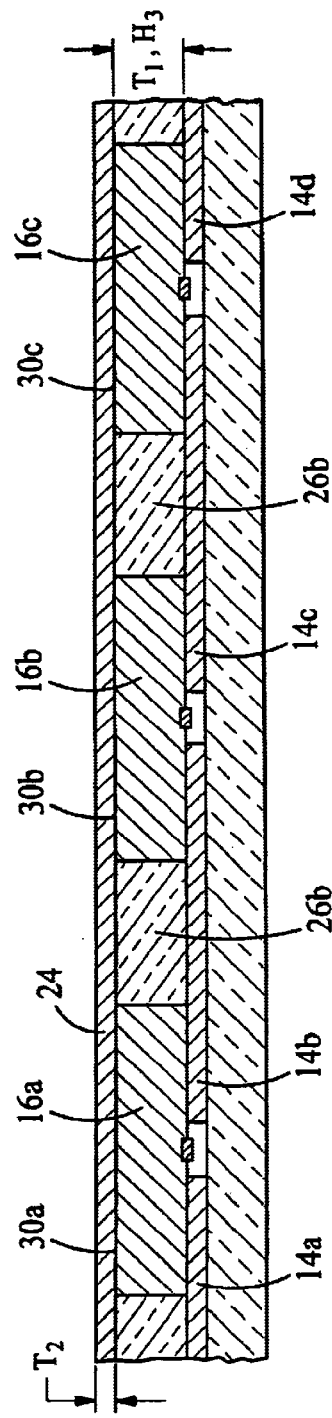
Figure 3B:
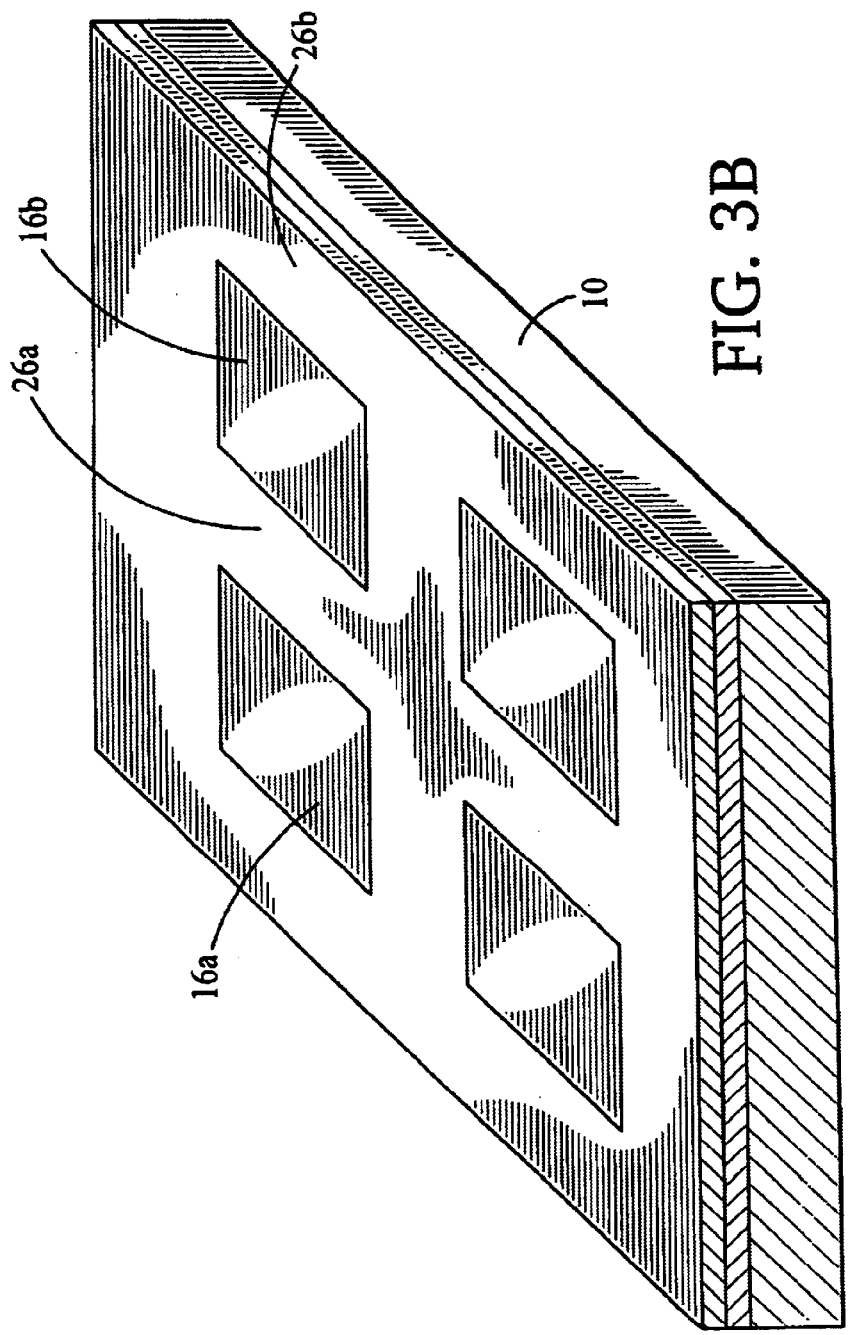
Figure 3C:
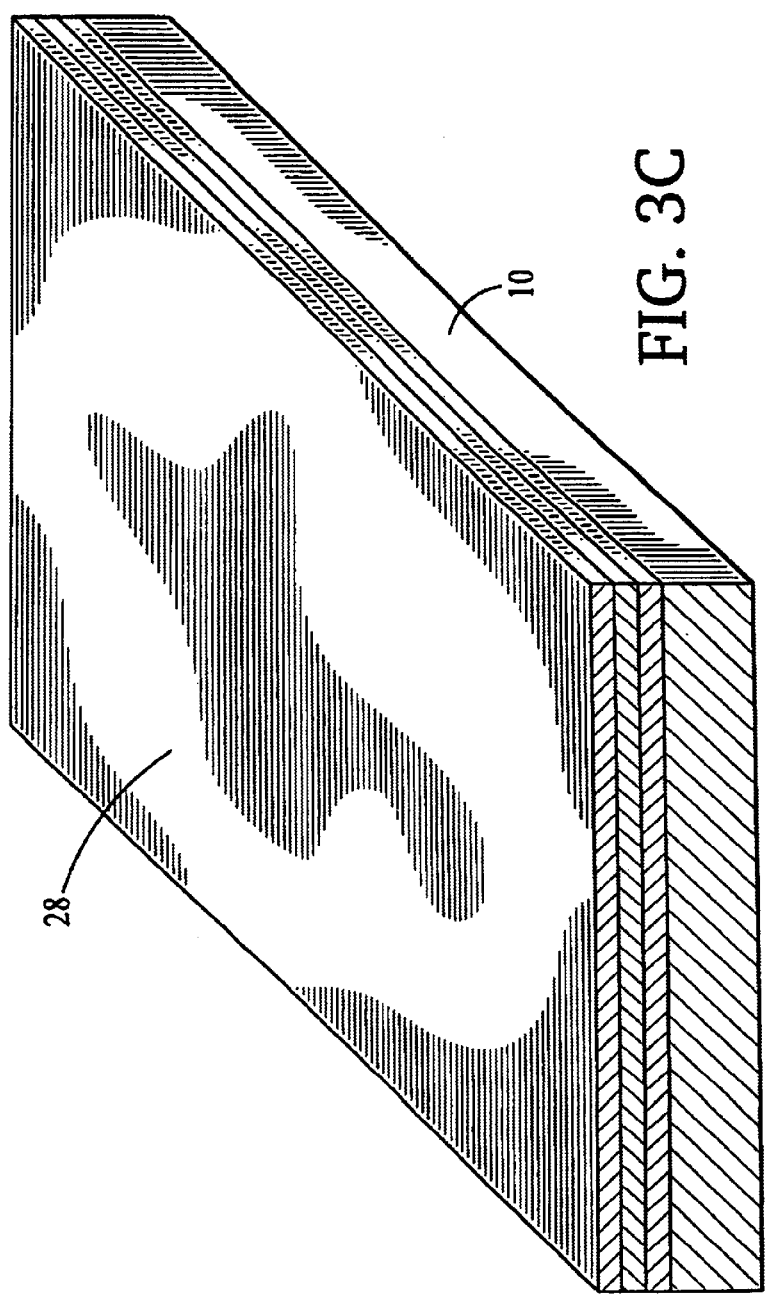

Referring to FIGS. 3A–3C, semiconductor chips 16a–16c are encapsulated with encapsulating material 24. Encapsulating material 24 is, e.g., Hysol®, manufactured by Dexter Corporation, Windsor Locks, Conn. Encapsulating material 24 is applied to chips 16a–16c by a thick film printing technique, using, for example, a P5 system, or by a fluid dispensing technique using, for example, a C-718 SMT system, manufactured by Asymtek of Carlsbad, Calif. During its application, encapsulating material 24 first fills spaces 26a, 26b between semiconductor chips 16a–16c. Within spaces 26a, 26b, encapsulating material has a thickness $T_1$ of, e.g., 50 μm to 600 μm, equal to a height $H_3$ of chips 16a–16c, e.g. 50 μm to 500 μm. Encapsulating material 24 is cured in an oven, such as a Blue M 146 Series Inert Gas Oven, manufactured by Lindberg, based in Watertown, Wis., at 150° C. for 30–60 minutes. Then, a coating 28 of encapsulating material 24 is formed over backsides 30a–30c of chips 16a–16c. Coating 28 is relatively thin with respect to the height $H_3$ of chips 16a–16c, having a thickness $T_2$ of, e.g., 5 μm to 200 μm. Encapsulating material 24 has a coefficient of thermal expansion (CTE) close to that of silicon, i.e. approximately $3 \times 10^{-6}$/K. Coating 28 is cured at 150–180° C. for 30–60 minutes. Encapsulating material 24 can be cured in two separate steps to minimize misfit between layers.

Figure 4A:
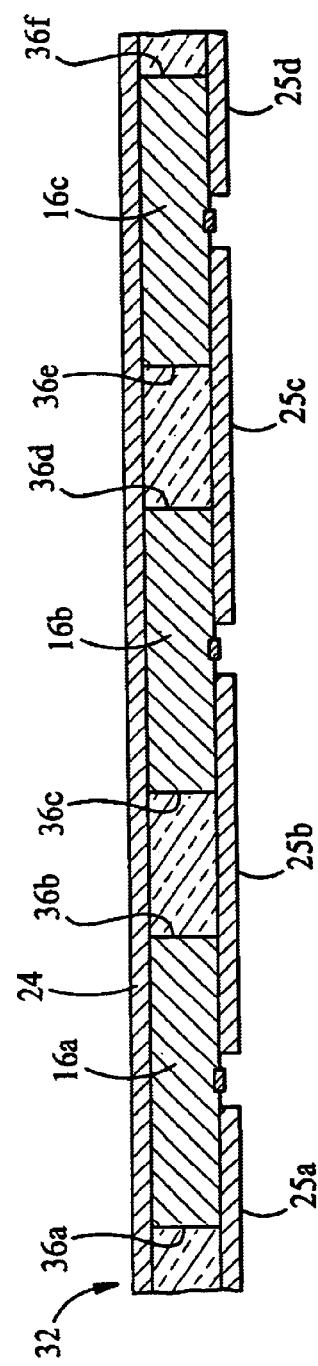
Figure 4B:
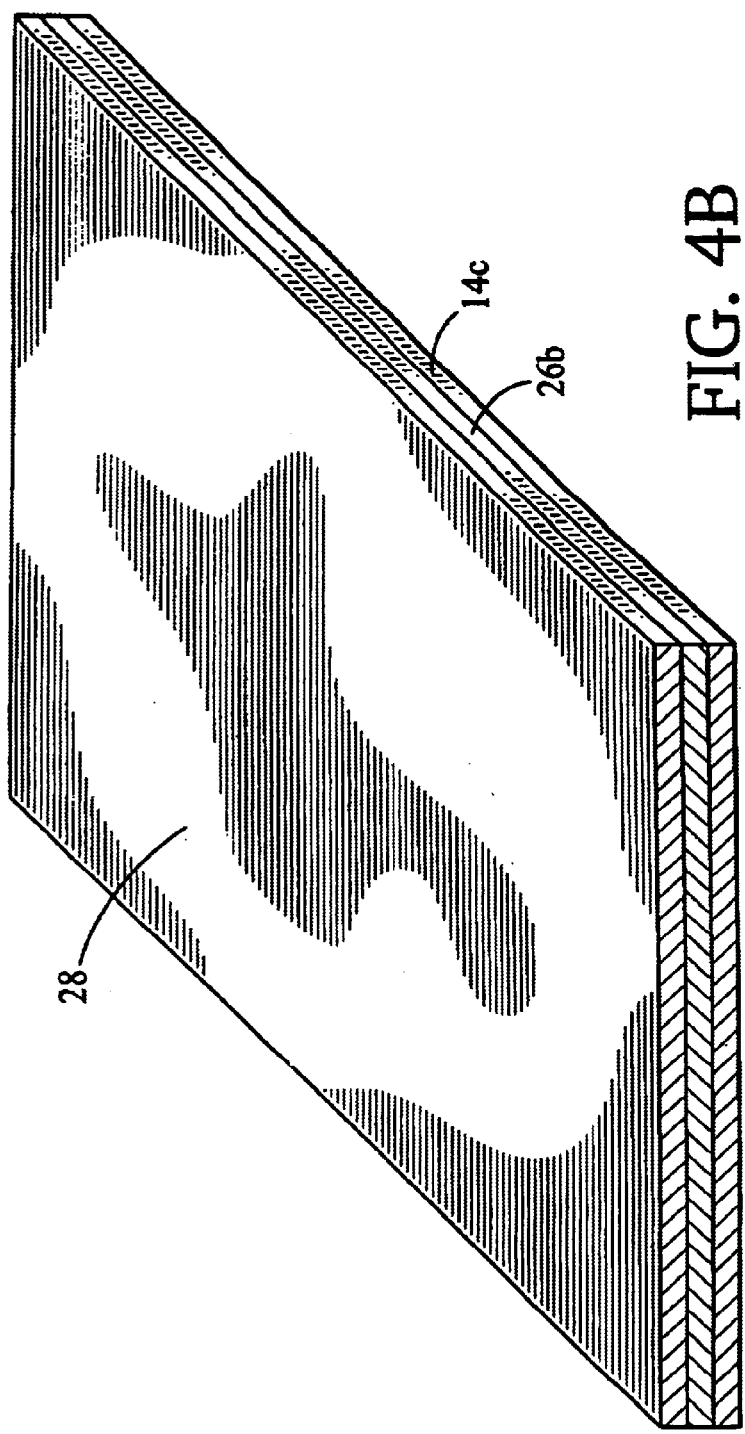

Referring also to FIGS. 4A and 4B, after encapsulation material 24 is cured, it becomes rigid. This rigidity allows one to separate transfer substrate 10 from dielectric regions 14a–14d in a bonding machine. The removal of transfer substrate 10 leaves a free-standing reconstituted wafer 32 that includes known good chips 16a–16c, with dielectric regions 14a–14d forming a front layer on chips 16a–16c. Dielectric regions 14a–14d extend beyond edges 36a–36f of chips 16a–16c. The thin coating thickness $T_2$ and the similarity between the CTE of encapsulating materials 24 and that of the silicon comprising chips 16a–16c minimize bending between chips 16a–16c. Reconstituted wafer 32 is sufficiently flat to be handled by automated handling systems.

Figure 5A:
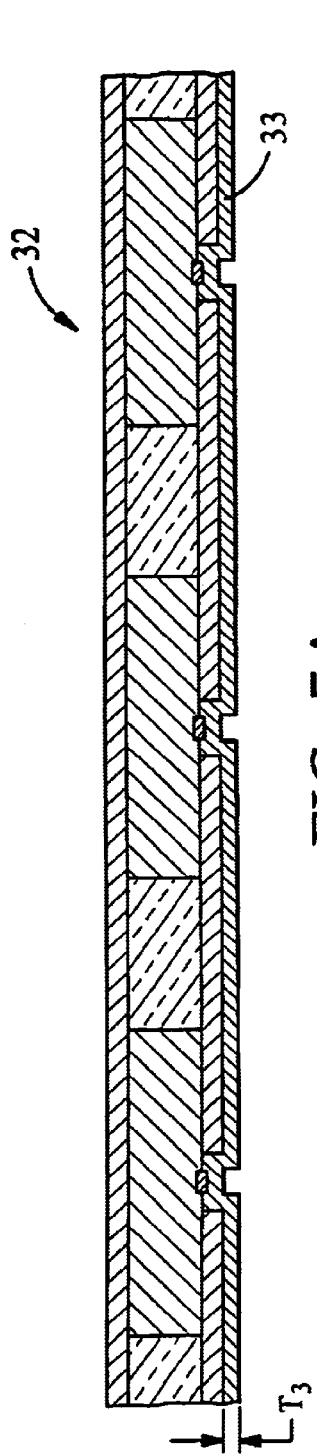

Referring to FIG. 5A, a conductive metallization layer 33, hereinafter referred to as "metallization layer," is deposited on dielectric regions 14a–14d on reconstituted wafer 32 by sputtering in a Clusterline manufactured by Unaxis, based in Switzerland. The metallization layer 33 includes an underlayer of titanium, with a thickness of 50 nm. Titanium provides good adhesion to dielectric regions 14a–14d. Metallization layer 33 also has a copper layer disposed over the titanium underlayer. Metallization layer 33 has a total thickness $T_3$ of 3 μm–6 μm.

Figure 5B:
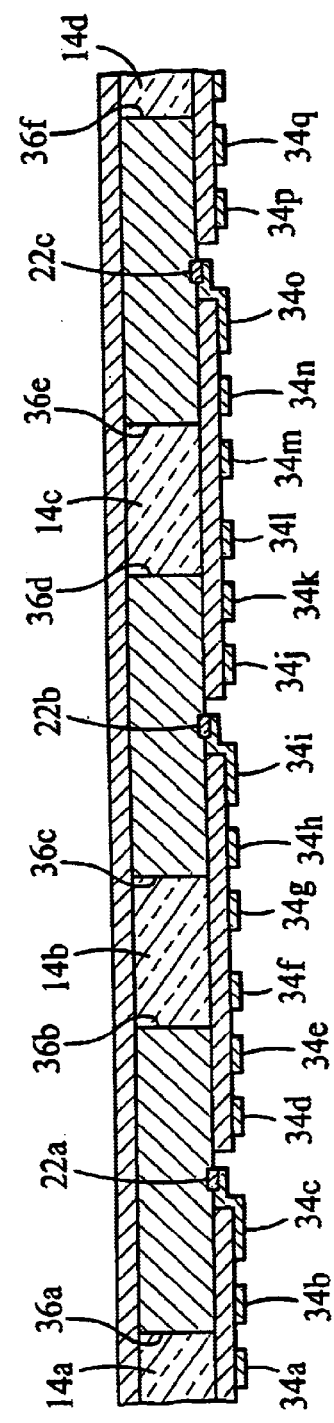
Figure 5C:
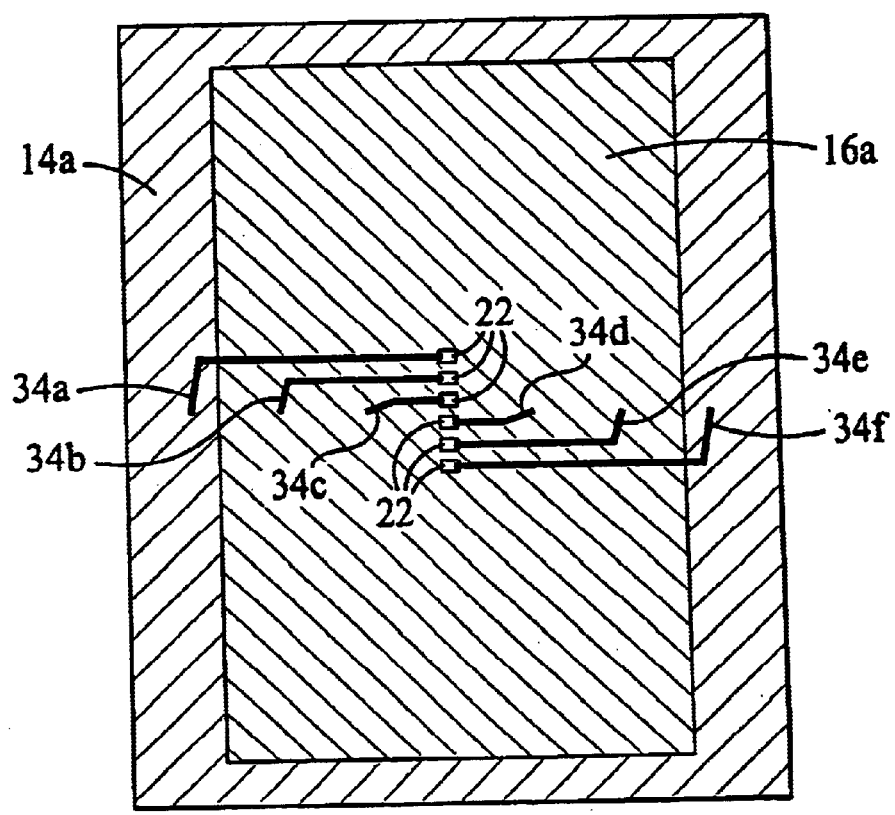

Referring also to FIGS. 5B–5C, metallization layer 33 is patterned using photolithographic and dry etching techniques to form conductive metal lines 34a–34c, hereinafter referred to as "metal lines." The use of standard wafer level patterning technologies is possible because of the flatness of reconstituted wafer 32. Metal lines 34c, 34i, 34o are in electrical communication with metal contact pads 22a–22c. Metal lines 34c, 34i, 34o serve as a redistribution network for contact pads 22a–22c. Some metal lines 34a, 34f, 34g, 34l, 34m extend beyond edges 36a–36e of chips 16a–16c. These metal lines 34a, 34f, 34g, 34l, 34m are also each connected to a contact pad 22 (contact pads 22 shown only on chip 16a). The extension of metal lines 34a, 34f, 34g, 34l, 34m beyond the chip edges 36a–36f, referred to as fan-out, is enabled by the presence of dielectric regions 14a–14d. Dielectric regions 14a–14d also extend beyond chip edges 36a–36f, thus providing a flat surface for metallization layer 33. The extension of dielectric regions 14a–14d beyond chip edges 36a–36f also reduces stress at edges 36a–36f by providing an additional stress-absorbing layer.

Referring to FIG. 5D, a solder stop mask 37 is applied and patterned. Standard photolithography techniques are used to pattern solder stop mask 37. Solder stop mask 37 is made of a polyimide, and it fills gaps between metal lines 34a–34q.

Referring to FIG. 6, interconnect elements, such as solder bumps 40a–40q, are formed on metal lines 34a–34q. Solder bumps 40a–40r are made of a solderable material, such as lead/tin alloy, and are formed in, e.g., a P5 system. Solder bumps 40a–40r have a pitch $P_1$, for example, of 800 μm. A solder bump pitch $P_1$ of 800 μm allows one to use semiconductor chips 16a–16c with standard printed circuit boards. One can, thereby, reduce the size and speed of semiconductor chips 16a–16c without requiring more expensive, complex printed circuit boards with smaller pitches.

Figure 7:
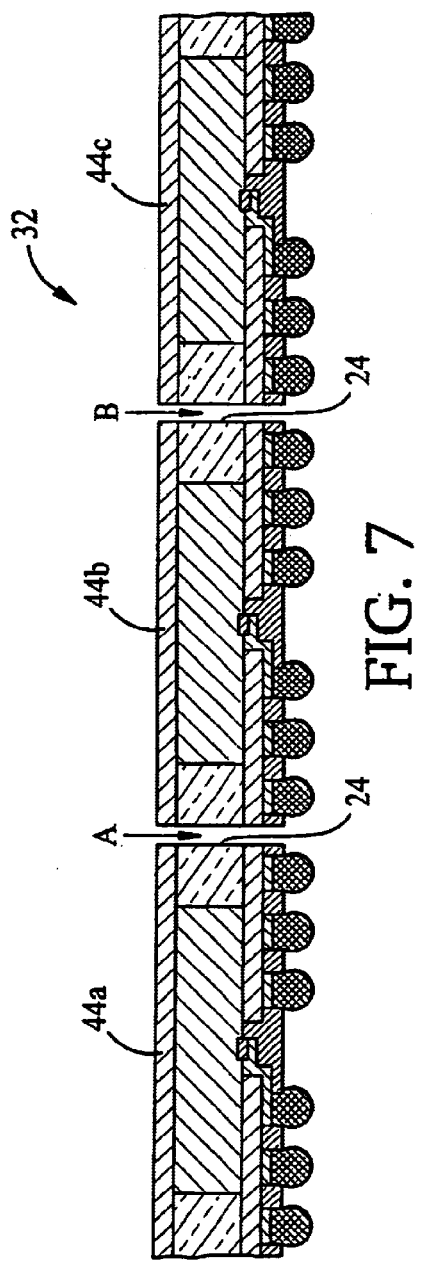

Referring to FIG. 7, reconstituted wafer 32 is cut into individual dies 44a–44c. Cutting wafer 32 into individual dies 44a–44c requires cutting only through encapsulation material 24, as indicated by arrows A, B. Cutting reconstituted wafer 32 is easier than the conventional cutting of silicon dies, because the latter requires cutting through a soft polymer and hard silicon. Cutting only polymer, such as encapsulation material 24, enables one to singulate dies 44a–44c quickly using a dicing blade.

Figure 8:
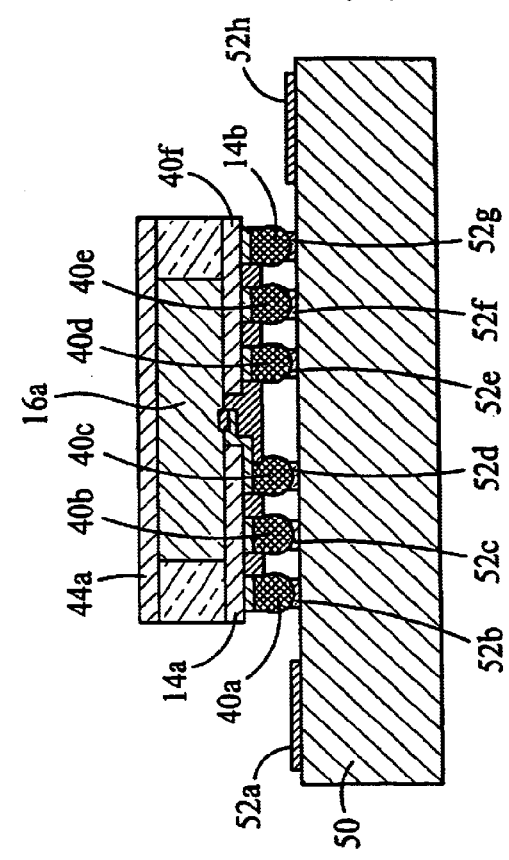

Referring to FIG. 8, after singulation of reconstituted wafer 32, the individual dies 44a–44c can be picked and placed by the die bonder onto an application board, such as a printed circuit board 50, onto which a solder paste is already printed. Printed circuit board 50 has metal contacts 52a–52h, is made of a polymer, and contains copper wire. Solder balls 40a–f of semiconductor chip 16a are soldered to metal contacts 52b–52g. The printed circuit board 50 is then reflowed in a conventional reflow oven, such as the V6 series, manufactured by rehm Anlagenbau GmbH, Germany.

The fan-out of metal lines 34a–34c beyond chip edges 36a–36b allows one to shrink the size of chip 16a without requiring a change in dimensions of metal contacts 52a–52h on printed circuit board 50. Standardization is facilitated by holding constant a footprint of chip 44a, i.e. a length $L_1$ between solder balls 40a–40f.

Figure 9:
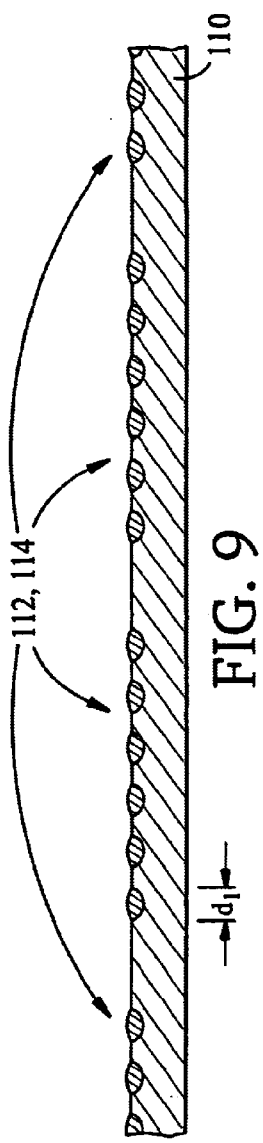
FIGS. 9–16 are cross-sectional and top views illustrating semiconductor chips at various stages during an execution of an alternative method for packaging thereof.

In a second embodiment, a compliant interlayer is provided. Here, referring to FIG. 9, a transfer substrate 110 has a plurality of hemispherical depressions 112. Each hemispherical depression 112 has a diameter $d_1$ of, e.g., ~50 $\mu$m–500 $\mu$m. Hemispherical depressions 112 are formed by photolithography and a wet etch. Each of the hemispherical depressions 112 is filled with a compliant material 114. Compliant material 114 is, e.g., silicone. Compliant material 114 is applied to depressions 112 by a thick film printing system, such as the P5 system.

Figure 10:
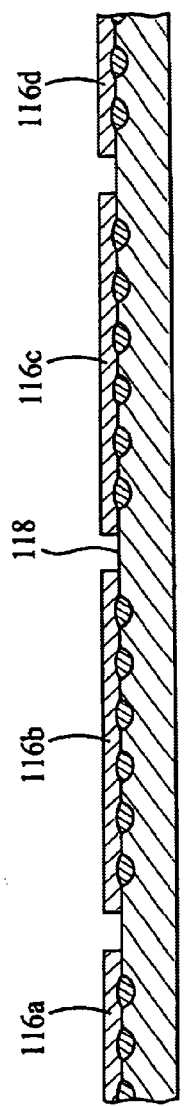

Referring to FIG. 10, an adhesive layer 116, patterned into adhesive regions 116a–116d, is applied to a top surface 118 of transfer substrate 110. Adhesive layer 116 is, for example, a printable polymide applied by a thick film printing system such as the P5 system.

Figure 11:
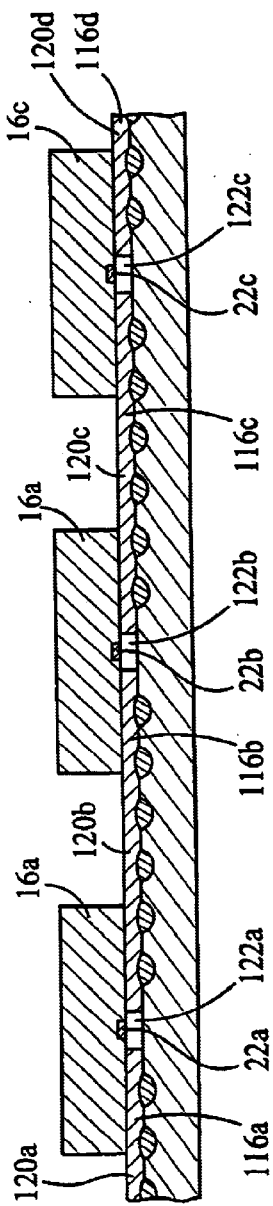

Referring to FIG. 11, singulated semiconductor chip 16a is flipped over and placed on top surfaces 120a–120b of adhesive regions 116a–116b, thereby bridging adjacent adhesive regions 116a–b. Top surface 20a of chip 16a thereby contacts adhesive region surfaces 120a–120b. Second and third chips 16b, 16c are similarly positioned across adhesive region surfaces 120b–120d. The plurality of chips 16a–16c is positioned across adhesive region surfaces 120a–120d in a bonding machine, such as the 2200 apm system, manufactured by Datacon, based in Austria. Chips 16a–16c adhere to adhesive region surfaces 120a–120d because adhesive regions 116a–116d, having not yet been cured, are still sticky after deposition. Metal contact pads 22a–22c are positioned proximate gaps 122a–122c between adhesive regions 116a–116d. Metal contact pads 22a–22c thereby remain uncovered.

Subsequent to the placing of chips 16a–16c on adhesive regions 116a–116d, adhesive layer 116a–116d and compliant material 114 are cured together in an oven at ~200° C. for 30–60 minutes.

Figure 12:
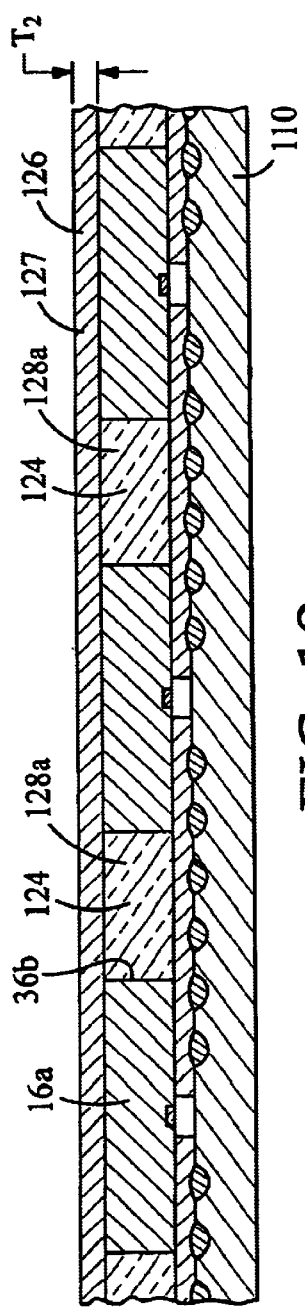

Referring to FIG. 12, chips 16a–16c are encapsulated with a first encapsulating material 124 and a second encapsulating material 126. First encapsulating material 124 fills gaps 128a–128b between chips 16a–16c. Second encapsulating material 126 is applied after the curing of the first encapsulating material 124. Second encapsulating material 126 has a thickness $T_2$ of, e.g., ~5 $\mu$m–200 $\mu$m, and forms a thin coating 127 over first encapsulating material 124 and backsides 30a–30c of chips 16a–16c. First and second encapsulating materials 124, 126 are selected to reduce stress between chips 16a–16c. First and second encapsulating materials 124, 126 are a compliant material such as silicone, manufactured by Wacker-Chemie, based in Germany. Alternatively, first and second encapsulating materials can be relatively hard, such as Hysol®, manufactured by Dexter, Windsor Locks, Conn. If the second encapsulating material 126 has a CTE close to that of silicon or if its Young's modulus is very low, no stress will be generated at the material interfaces, such as edge 36b of chip 16a and first encapsulating material 124.

Figure 13:
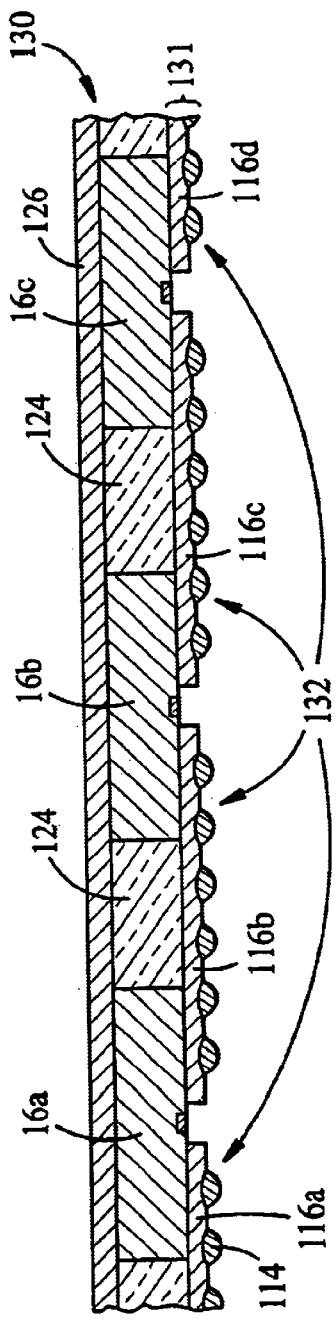

Referring to FIG. 13, after first and second encapsulation materials 124, 126 are cured, they become rigid. This rigidity allows one to separate transfer substrate 110 from compliant material 114 and adhesive regions 116a–116d in a bonding machine. The removal of transfer substrate 110 leaves a free-standing reconstituted wafer 130 comprising known good chips 16a–16c. The reconstituted wafer 130 has a front layer 131, including compliant material 114 and adhesive regions 116a–116d. Reconstituted wafer 130 remains flat rather than bowed because of the reduction of stress by first and second encapsulating materials 124, 126. Compliant material 114 forms a plurality of compliant bumps 132 on reconstituted wafer 130.

Figure 14C:
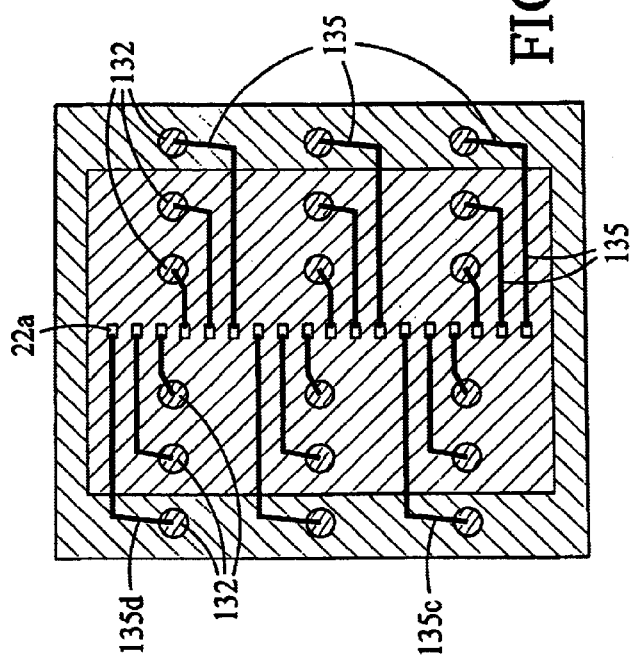

Referring to FIGS. 14A, 14B, and 14C, metal is deposited on compliant bumps 132 and adhesive layer 116a–116d by sputtering in a sputtering system, such as the Clusterline, manufactured by Unaxis, based in Switzerland. Resulting metallization layer 134 includes an underlayer of titanium and a copper layer. Metallization layer 134 is patterned using a special resist coating technology because the relief structure on the wafer i.e., compliant bumps 132 and adhesive layer 116a–116d which does not allow standard coating like spin coating. Electroplating of photoresist is a process which allows control of layer thickness. It thereby enables a resist layer to be formed that has the same thickness at each point of the relief structure. An appropriate resist is PEPR 2200 from Shipley, applied in an ED-coater, Equinox™, manufactured by Semitool, based in Kalispell, Mont. A wet etching process defines metal lines 135a–135c.

Metal lines 135a–135c are in electrical communication with metal contact pads 22a–22c. Some of the plurality of metal lines 135, e.g. lines 135d, 135e, extend beyond edges 36a–36f of chips 16a–16c. Similarly, portions of front layer 131, including compliant bumps 132 and adhesive regions 116a–116d, extend beyond edges 36a–36f of chips 16a–16c.

Figure 15:
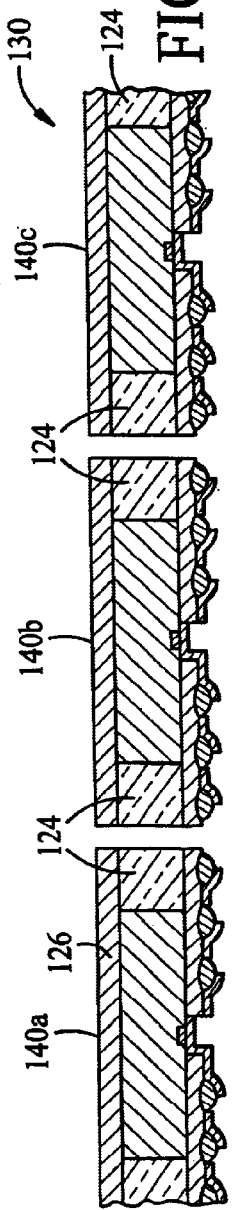

Referring to FIG. 15, reconstituted wafer 130 is cut into individual dies 140a–140c. To singulate the dies 140a–140c, a polymer dicing blade cuts through first and second encapsulating materials 124, 126.

Figure 16:
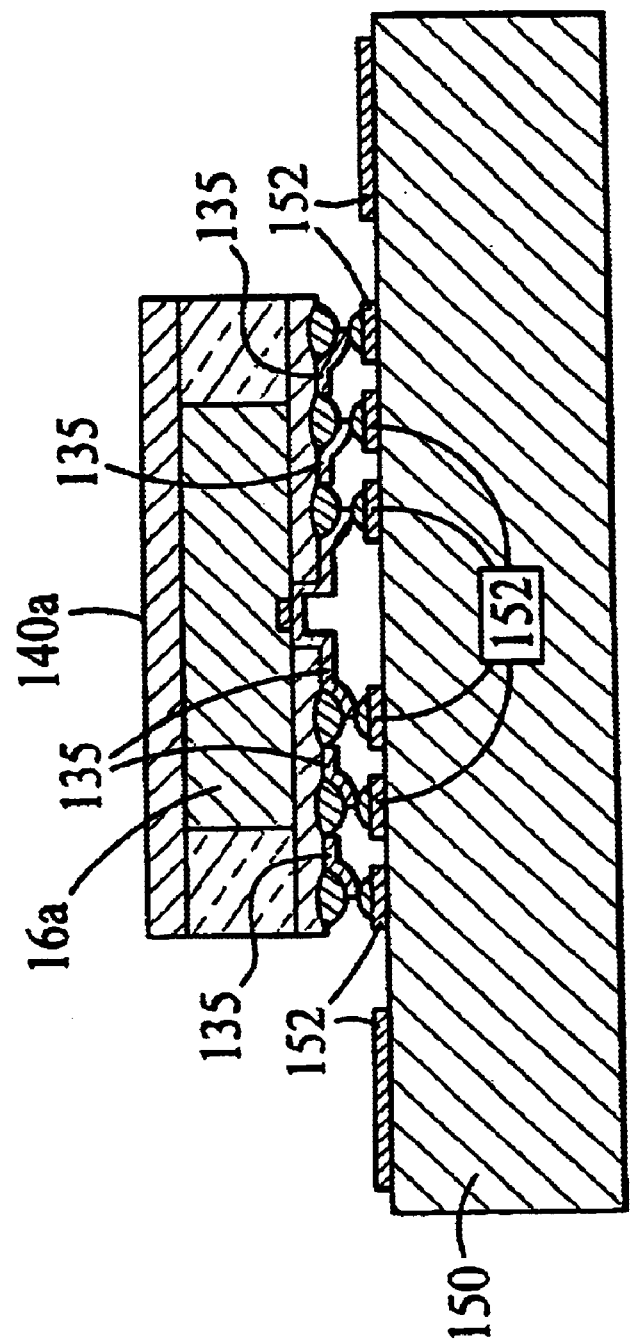

Referring to FIG. 16, a printed circuit board 150 has a plurality of metal contacts 152. Metal contacts 152 are soldered to the plurality of metal lines 135 of chip 16a. Die 140a is thereby connected to, and is in electrical communication with, printed circuit board 150.

Figure 17:
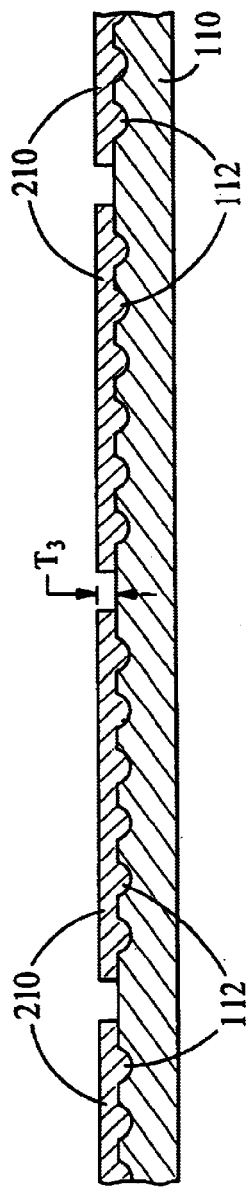
FIGS. 17–23 are cross-sectional and top views illustrating semiconductor chips at various stages during an execution of another alternative method for packaging thereof.

Referring to FIG. 17, in a third embodiment, a compliant relief front layer 210 fills the hemispherical depressions 112 of transparent transfer substrate 110. Compliant relief front layer 210 is a compliant material such as silicone. Compliant relief front layer 210 extends beyond top surface 118 of substrate 110. Compliant relief layer 210 has a thickness $T_3$, of, e.g., 10–200 $\mu$m. Compliant relief front layer 210 is deposited in accordance with a predetermined pattern by a thick film printing system.

Figure 18:
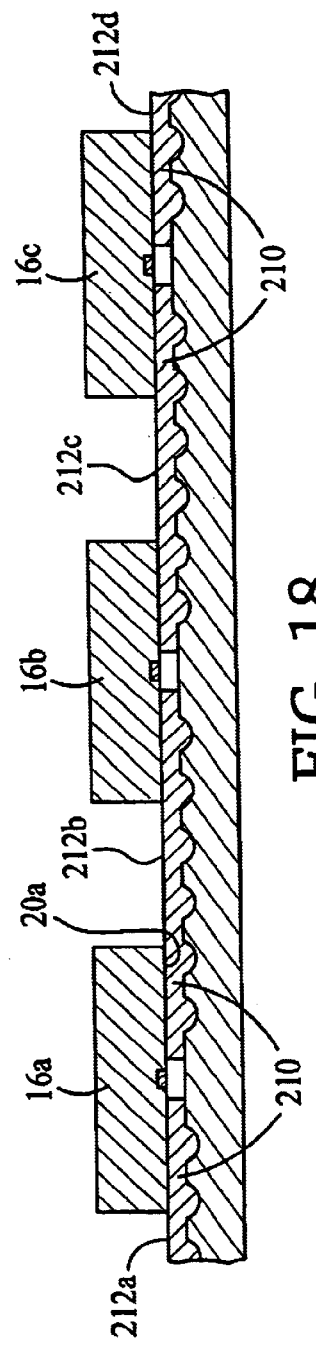

Referring to FIG. 18, singulated semiconductor chip 16a is flipped over and placed on a top surface 212a–212b of compliant relief front layer 210. Top surface 20a of chip 16a thereby contacts compliant relief front layer 210. Second and third chips 16b, 16c are similarly positioned on top surfaces 212b–212d of compliant relief front layer 210. The plurality of chips 16a–16c is positioned on compliant relief front layer 210 in a bonding machine.

Figure 19:
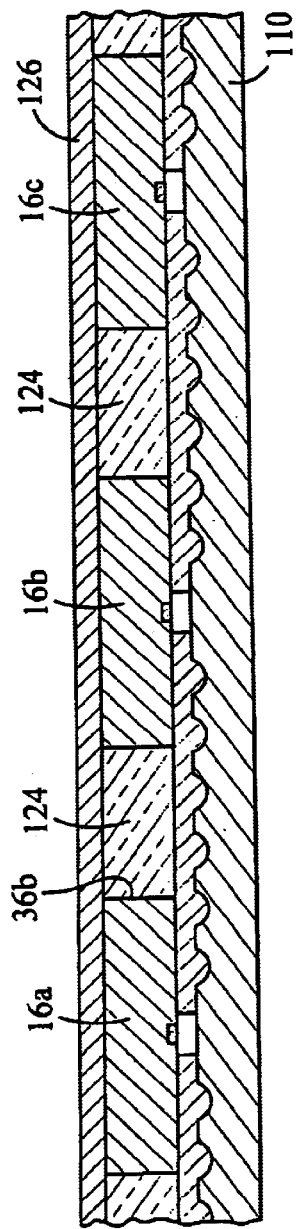

Referring to FIG. 19, chips 16a–16c are encapsulated with first encapsulating material 124 and second encapsulating material 126, as described above in connection with FIG. 12.

Figure 20:
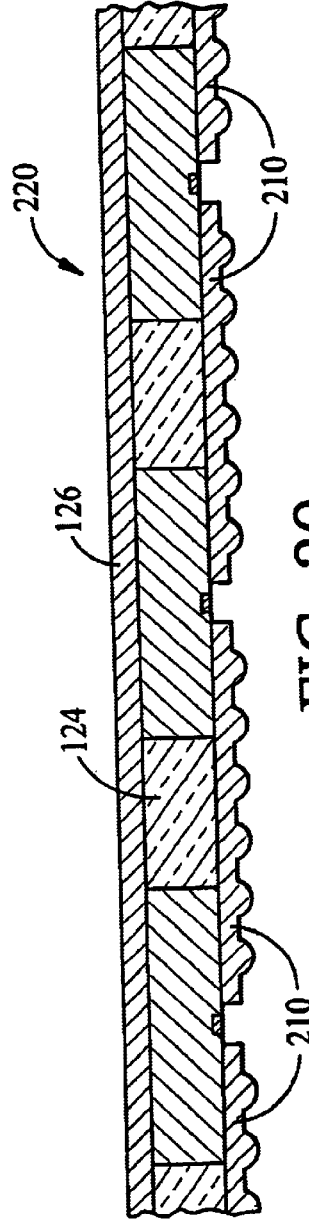

Referring to FIG. 20, after the curing of first and second encapsulating materials 124, 126, transfer substrate 110 is removed, leaving a free-standing reconstituted wafer 220 having compliant relief front layer 210.

Figure 21:
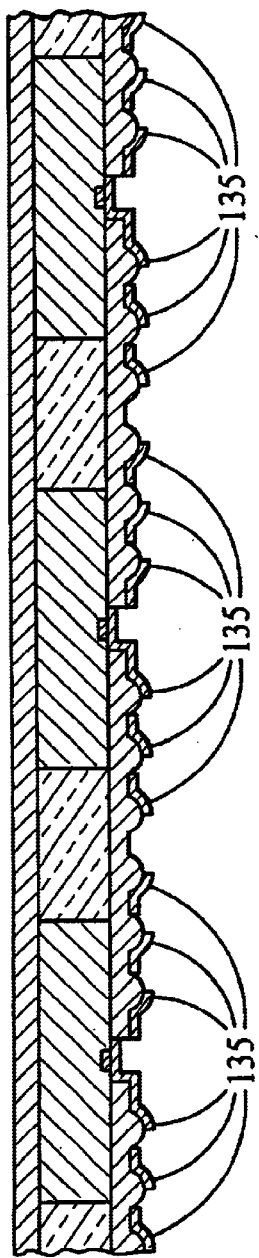

Referring to FIG. 21, metal lines 135 are defined in a metallization layer, as described above in connection with FIGS. 14A and 14B.

Figure 22:
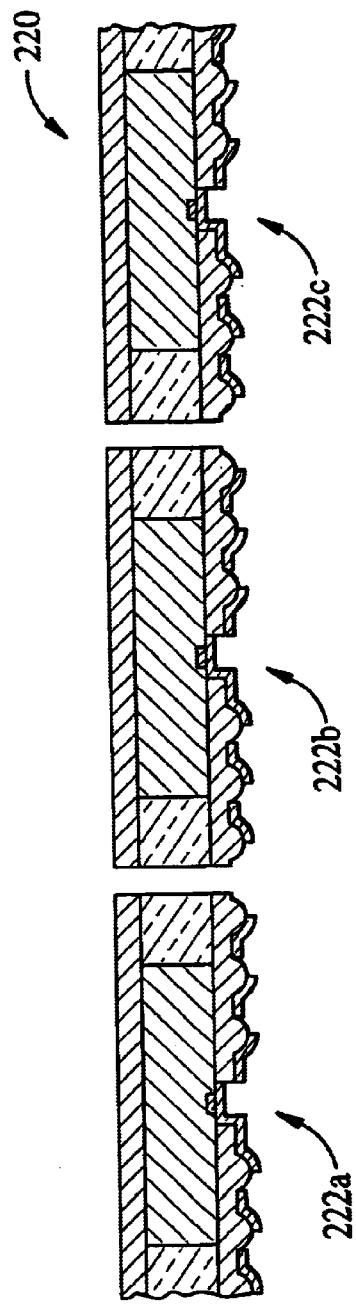

Referring to FIG. 22, reconstituted wafer 220 is cut into individual dies 222a–222c.

Figure 23:
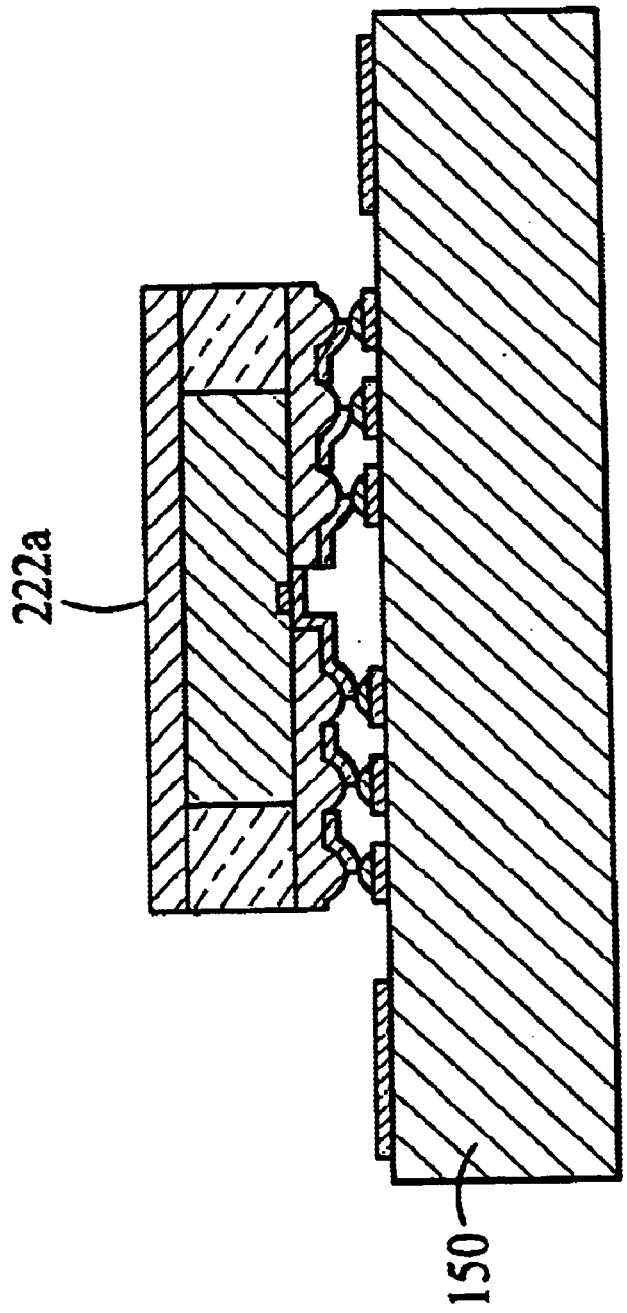

Referring to FIG. 23, die 222a is soldered to printed circuit board 150, as described above in connection with FIG. 16.

A number of embodiments of the invention have been described. Nevertheless, it will be understood that various modifications may be made without departing from the spirit and scope of the invention. For example, the transfer substrate can be made of metal. It can have a round shape, with a diameter of, e.g., 300 mm. The depressions in the transfer substrate can be elongated grooves. The monatomic layer can be polyethylene or Teflon®. Dielectric layer can be a soft layer like silicone, or a hard layer like polyimide or an epoxy, or another polymer. The latter can be on the order of 1000 times less compliant than silicone. The selection of material for the dielectric layer is based at least in part on the type of interconnections which are used. Compliancy should be provided by at least the dielectric layer or the interconnections. For example, if the interconnections are compliant, a harder dielectric can be used. If the interconnections are hard, the dielectric layer should be flexible. If a chip is not extremely large, i.e. if the distance of solder balls to a neutral point is less than ~5 mm, a compliant interlayer is not necessary for meeting standard reliability demands. A neutral point on the chip is the region on the chip where the stress is zero, i.e. the symmetrical center of the chip.

The dielectric layer can be cured in the die bonder.

In the case of very thin chips, i.e. having a thickness of less than 100 $\mu$m, a second transfer substrate on the encapsulating layer can be used to increase the mechanical stability during subsequent thin film processing steps. The encapsulating material can be polyimide, BCB, JSR, Porbelec or silicone.

The device formed in the semiconductor chip can be a micro-electromechanical device.

The metallization layer can have a total thickness ranging from 2–5 $\mu$m.

If the chip will be connected to a board by soldering, a solder stop mask can be formed by printing with a P5 system. A solder stop mask can be made of photosensitive benzocyclobutene (BCB) or polybenzoxazole (PBO).

Interconnect elements can be solder bumps can be made of solder, a conductive adhesive, or metal covered bumps.

The pitch for solder bump arrays can range from 500 $\mu$m–800 $\mu$m.

The adhesive layer is typically made of a hard epoxy. If greater resolution is required than that which can be obtained by printing, the adhesive layer can be applied by standard microelectronic processes like spin coating/spray coating and lithography.

Prior to die singulation, the functionality of individual chips can be tested. Prior to die singulation of reconstructed wafers, burn-in can be conducted. Dies can be singulated by dicing or punching. Accordingly, other embodiments are within the scope of the following claims.

What is claimed is:

1. A semiconductor structure, comprising:
   a semiconductor chip having an edge and a surface;
   a contact pad disposed on the surface of the semiconductor chip; and
   a conductive layer disposed on the surface of the semiconductor chip and in contact with the contact pad, the conductive layer having a portion that extends beyond the edge of the semiconductor chip.

2. The structure of claim 1, wherein the conductive layer comprises a metal line.

3. The semiconductor structure of claim 1, wherein the chip comprises a device.

4. The semiconductor structure of claim 3, wherein the device comprises an integrated circuit.

5. The semiconductor structure of claim 3, wherein the device comprises a micro-electromechanical device.

6. The semiconductor structure of claim 1, further comprising:
   a front layer, having a first portion disposed on the surface of the semiconductor chip, and a second portion extending beyond the edge of the semiconductor chip, the conductive layer being disposed on the front layer.

7. The semiconductor structure of claim 6, wherein the front layer is a dielectric layer.

8. The semiconductor structure of claim 6, wherein the front layer is compliant.

9. The semiconductor structure of claim 6, wherein the front layer includes a bump.

10. The semiconductor structure of claim 6, wherein the second portion of the front layer extends beyond an edge of a second semiconductor chip.

11. A semiconductor structure, comprising:
    a semiconductor chip having a surface and an edge;
    a contact pad disposed on the surface of the semiconductor chip; and
    a front layer, having a first portion disposed on the surface of the semiconductor chip, and a second portion extending beyond the edge of the chip.

12. The semiconductor structure of claim 11, wherein the second portion of the front layer extends beyond an edge of a second semiconductor chip.

13. The semiconductor structure of claim 11, further comprising:
    a conductive layer disposed on the surface of the semiconductor chip, the conductive layer having a portion that extends beyond the edge of the semiconductor chip.

14. The semiconductor structure of claim 11, wherein the front layer is a dielectric layer.

15. The semiconductor structure of claim 11, wherein the front layer is compliant.

16. The semiconductor structure of claim 11, wherein the front layer includes a bump.

* * * * *